(12) United States Patent
Mason et al.

(10) Patent No.: US 7,726,976 B2
(45) Date of Patent: Jun. 1, 2010

(54) SHIELDED ELECTRICAL INTERCONNECT

(75) Inventors: Jeffery W. Mason, North Attleboro, MA (US); Wayne S. Alden, III, Whitman, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/938,135

(22) Filed: Nov. 9, 2007

(65) Prior Publication Data

US 2009/0124100 A1 May 14, 2009

(51) Int. Cl.
*H01R 12/00* (2006.01)
(52) U.S. Cl. .......................................... 439/66; 439/91
(58) Field of Classification Search ............. 439/65–66, 439/591, 91
See application file for complete search history.

(56) References Cited

U.S. PATENT DOCUMENTS

| | | | |
|---|---|---|---|
| 3,971,610 A | 7/1976 | Buchoff et al. | |
| 5,397,240 A | 3/1995 | Herard | |
| 5,474,458 A | 12/1995 | Vafi et al. | |
| 5,599,193 A | 2/1997 | Crotzer | |
| 5,624,268 A | 4/1997 | Maeda et al. | |
| 6,056,557 A | 5/2000 | Crotzer et al. | |
| 6,264,476 B1 * | 7/2001 | Li et al. ........................ | 439/66 |
| 6,271,482 B1 | 8/2001 | Crotzer et al. | |
| 6,348,659 B1 | 2/2002 | Crotzer et al. | |
| 6,394,821 B1 | 5/2002 | Matsumura et al. | |
| 6,416,331 B1 | 7/2002 | Shimizu | |
| 6,638,077 B1 * | 10/2003 | Fan et al. ....................... | 439/66 |
| 6,709,277 B2 | 3/2004 | Ruttan et al. | |
| 6,712,621 B2 * | 3/2004 | Li et al. ......................... | 439/65 |
| 6,790,057 B2 * | 9/2004 | DelPrete et al. ............... | 439/91 |
| 2003/0186572 A1 | 10/2003 | Hougham et al. | |
| 2008/0242128 A1 * | 10/2008 | Hilty et al. .................... | 439/91 |

* cited by examiner

*Primary Examiner*—Edwin A. Leon
*Assistant Examiner*—Vanessa Girardi

(57) ABSTRACT

An electrical interconnect includes a contact array having an insulator holding a plurality of contacts. Each of the contacts include a conductive polymer column having first and second opposite contact tips for interconnecting first and second electronic packages, wherein each of the contacts are individually shielded from adjacent ones of the contacts. Optionally, a frame may be provided on the insulator and positioned between each of the contacts, wherein the frame defines a shield concentrically surrounding each of the contacts. The frame may be conductive and non-coplanar with, and parallel to, the insulator, wherein the frame is electrically isolated from the contacts and provides shielding between adjacent ones of the contacts.

20 Claims, 6 Drawing Sheets

SHIELDED ELECTRICAL INTERCONNECT

BACKGROUND OF THE INVENTION

The subject matter herein relates generally to electrical interconnects, and more particularly, to electrical interconnects having conductive polymer contacts that are shielded.

The ongoing trend toward smaller, lighter, and higher performance electrical components and higher density electrical circuits has led to the development of surface mount technology in the design of electronic packages, such as circuit boards and/or electronic devices. As is well understood in the art, surface mountable packaging allows for the connection of the package to pads on the surface of the circuit board or device rather than by contacts or pins soldered in plated holes. Surface mount technology allows for an increased component density.

Interconnect devices for these electronic packages using conductive elastomeric members are known. One such interconnect device uses conductive elastomeric columns disposed in holes in a substrate on a predetermined grid array. The assembly is positioned between adjacent electronic packages so as to make conductive contact between conductive pads on the opposing packages. However, these known interconnect devices are susceptible to damage from over compression of the columns. Over-compression can cause stress and/or distortion of the conductive elements resulting from the application of axial compressive forces to the columns.

Accordingly, a need remains for interconnect systems that can accommodate the high component density of certain electronic packages, while maintaining stability and reliability. Additionally, a need remains for interconnect systems that can accommodate the high performance and throughput of certain electronic packages.

BRIEF DESCRIPTION OF THE INVENTION

In one embodiment, an electrical interconnect is provided that includes a contact array having an insulator holding a plurality of contacts. Each of the contacts include a conductive polymer column having first and second opposite contact tips for interconnecting first and second electronic packages, wherein each of the contacts are individually shielded from adjacent ones of the contacts.

Optionally, a frame may be provided on the insulator and positioned between each of the contacts, wherein the frame defines a shield having apertures concentrically surrounding each of the contacts. The frame may be metallic and non-coplanar with, and parallel to, the insulator, wherein the frame is electrically isolated from the contacts and provides shielding between adjacent ones of the contacts. The frame may include a plurality of apertures therethrough, wherein each of the contacts are received in respective ones of the apertures, and the frame defines a shield layer between adjacent ones of the contacts. Optionally, the frame may define a load bearing member which limits compression of the contacts. A first frame may be provided on a first side of the insulator and a second frame may be provided on a second side of the insulator.

In another embodiment, an electrical interconnect is provided including a contact array having an insulator holding a plurality of contacts. Each of the contacts include a conductive polymer column having first and second opposite contact tips for interconnecting first and second electronic packages. The insulator has a first surface and an opposite second surface. A frame is provided on at least one of the first and second surfaces, and the frame has a plurality of apertures separated by a frame web. Each aperture receives a respective one of the contacts, and the frame web individually shields adjacent ones of the contacts.

In a further embodiment, an electronic assembly is provided that includes a first electronic package, a second electronic package, and an electrical interconnect for interconnecting the first and second electronic packages. The electrical interconnect includes a contact array having an insulator holding a plurality of contacts and a frame provided on the insulator. Each of the contacts include a conductive polymer column having first and second opposite contact tips for engaging respective ones of the first and second electronic packages. The frame has a plurality of apertures each receiving a respective one of the contacts, and the frame individually shields adjacent ones of the contacts.

DETAILED DESCRIPTION OF THE INVENTION

Figure 1:
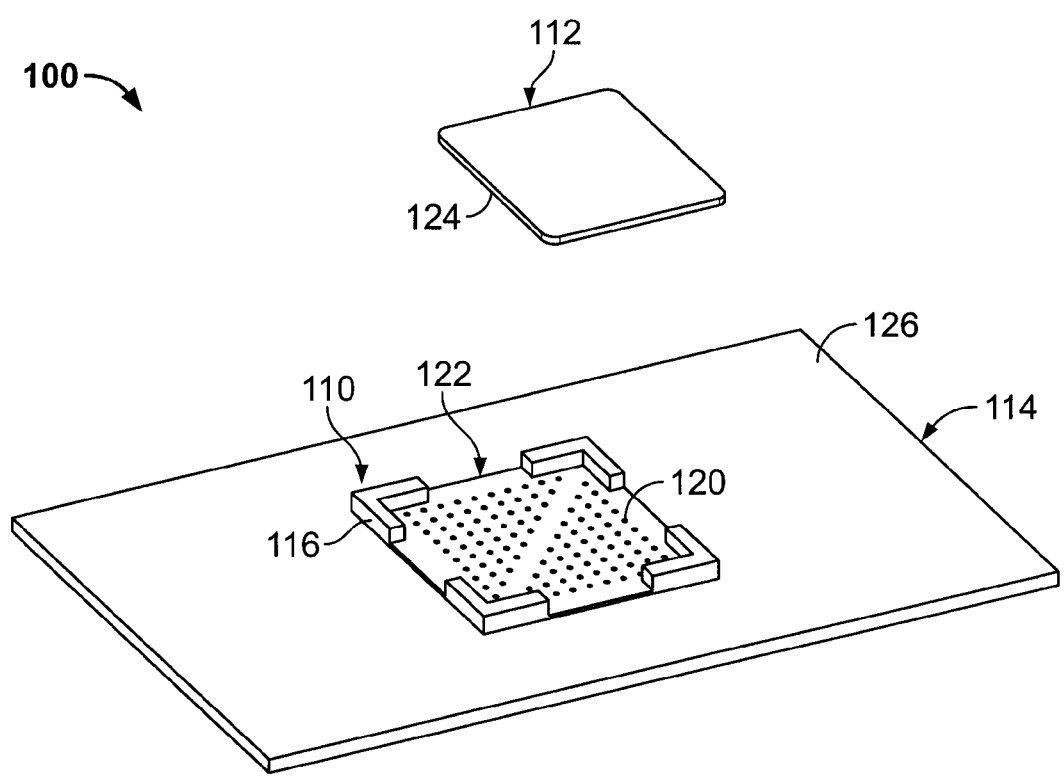
FIG. 1 illustrates an electronic assembly having an electrical interconnect formed in accordance with an exemplary embodiment.

FIG. 1 illustrates an electronic assembly 100 having an electrical interconnect 110 formed in accordance with an exemplary embodiment. The electrical interconnect 110 is used to interconnect two electronic packages 112, 114. The electronic packages 112 and 114 may be either circuit boards or electronic devices, such as land grid array (LGA) or ball grid array (BGA) devices. The LGA or BGA devices may be a chip or module, such as, but not limited to, a central processing unit (CPU), microprocessor, or an application specific integrated circuit (ASIC), or the like. As such, the electrical interconnect 110 may be one of a board-to-board, board-to-device, or device-to-device type of interconnect system.

In the illustrated embodiment, the electrical interconnect 110 is a board-to-device interconnect system. The electrical interconnect 110 is mounted on the second electronic package 114, which is illustrated as, and may be referred to hereinafter as, a circuit board 114. A housing 116 is used to position the socket assembly 110 with respect to the circuit board 114. The housing 116 may completely surround the perimeter of the socket assembly 110, or alternatively, may have separate components provided at predetermined portions of the socket assembly 110, as is illustrated in FIG. 1. The first electronic package 112, which is illustrated as, and may be referred to hereinafter as, an LGA package 112, is loaded onto the electrical interconnect 110. The housing 116 is used to align the LGA package 112 with the electrical interconnect 110 and the circuit board 114. When loaded onto the electrical interconnect 110, the LGA package 112 is electrically connected to the circuit board 114.

In an exemplary embodiment, the electrical interconnect 110 includes a plurality of compressive polymer contacts 120 arranged in and held in a contact array 122. The contacts 120 within the contact array 122 are arranged in a predetermined pattern. The LGA package 112 has a mating surface 124 having a plurality of contact pads (not shown in FIG. 1) that engage the contacts 120. The circuit board 114 also has a mating surface 126 having a plurality of contact pads (not shown in FIG. 1) that engage the contacts 120. The contact pads of the LGA package 112 and the circuit board 114 each have a substantially similar pattern as the contacts 120 for mating thereto. The contacts 120 electrically connect the LGA package 112 to the circuit board 114.

Figure 2:
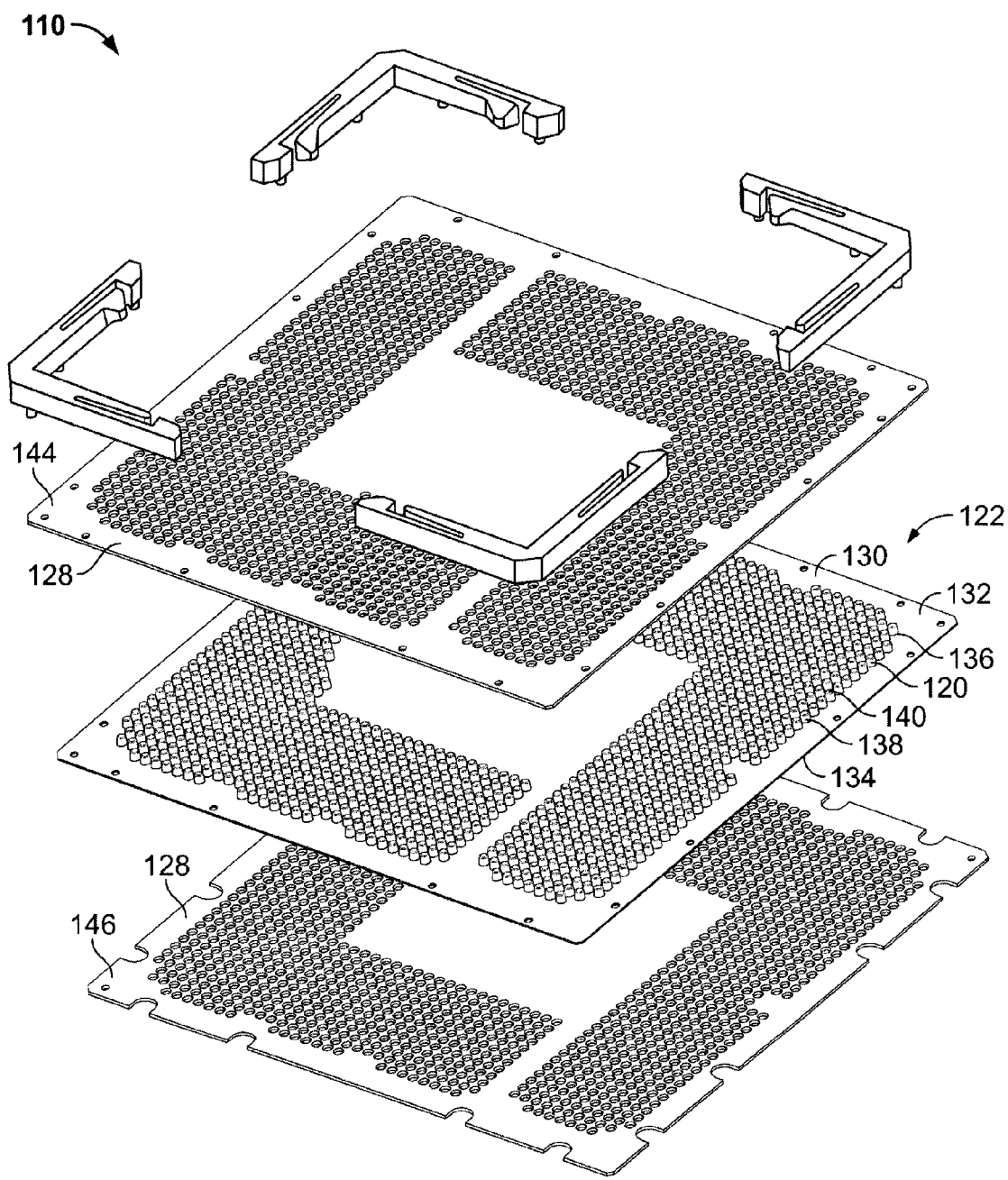
FIG. 2 is an exploded view of the electrical interconnect shown in FIG. 1.

FIG. 2 is an exploded view of the electrical interconnect 110. The electrical interconnect 110 includes the contact array 122 and a frame 128 provided on the contact array 122. In an exemplary embodiment, the frame 128 operates as an anti-overstress load bearing member that stops or limits compression of the contacts 120 when the electronic assembly 110 (shown in FIG. 1) is assembled. The frame 128 also operates as a shield for the contact array 122.

The contact array 122 includes an insulative substrate 130, which is also referred to hereinafter as an insulator 130. In an exemplary embodiment, the insulator 130 is a polyimide sheet, but other types of insulative substrates may be used. The insulator 130 includes opposed first and second sides 132, 134 and a plurality of apertures 136 therethrough arranged in a predetermined pattern. The compressive polymer contacts 120 are retained within the apertures 136 of the insulator 130. Optionally, the contacts 120 may be molded or otherwise disposed within the insulator 130.

In an exemplary embodiment, the compressive polymer contacts 120 have a polymer base or column 138 and metal particles within the polymer column 138. Optionally, the column 138 may have a generally frusto-conical shape at each end of the column 138. One example of a polymer compound that may be used to fabricate the column 138 is a silicone material, such as silicone rubber. Any metal particles, including silver may be dispersed throughout the polymer column 138 to form the contacts 120. When compressed, the contacts 120 function as a conductor, which provides an electrically conductive path. The contacts 120 thus define conductive polymer columns that extend between opposed mating tips or ends 140, 142 (shown in FIG. 5), which are arranged for mating engagement with the contact pads of the first and second electronic packages 112, 114 (shown in FIG. 1). An example of a polymer-based compressible contact 120 is a metallized-particle interconnect (MPI) column developed by Tyco Electronics.

The frame 128 includes first and second frame elements 144, 146 provided on respective sides 132, 134 of the insulator 130. While the frame 128 is illustrated as being separate components, the frame 128 may be a single element in an alternative embodiment. Additionally, only one frame element may be used in some alternative embodiments. The frame 128 is described in further detail below.

Figure 3:
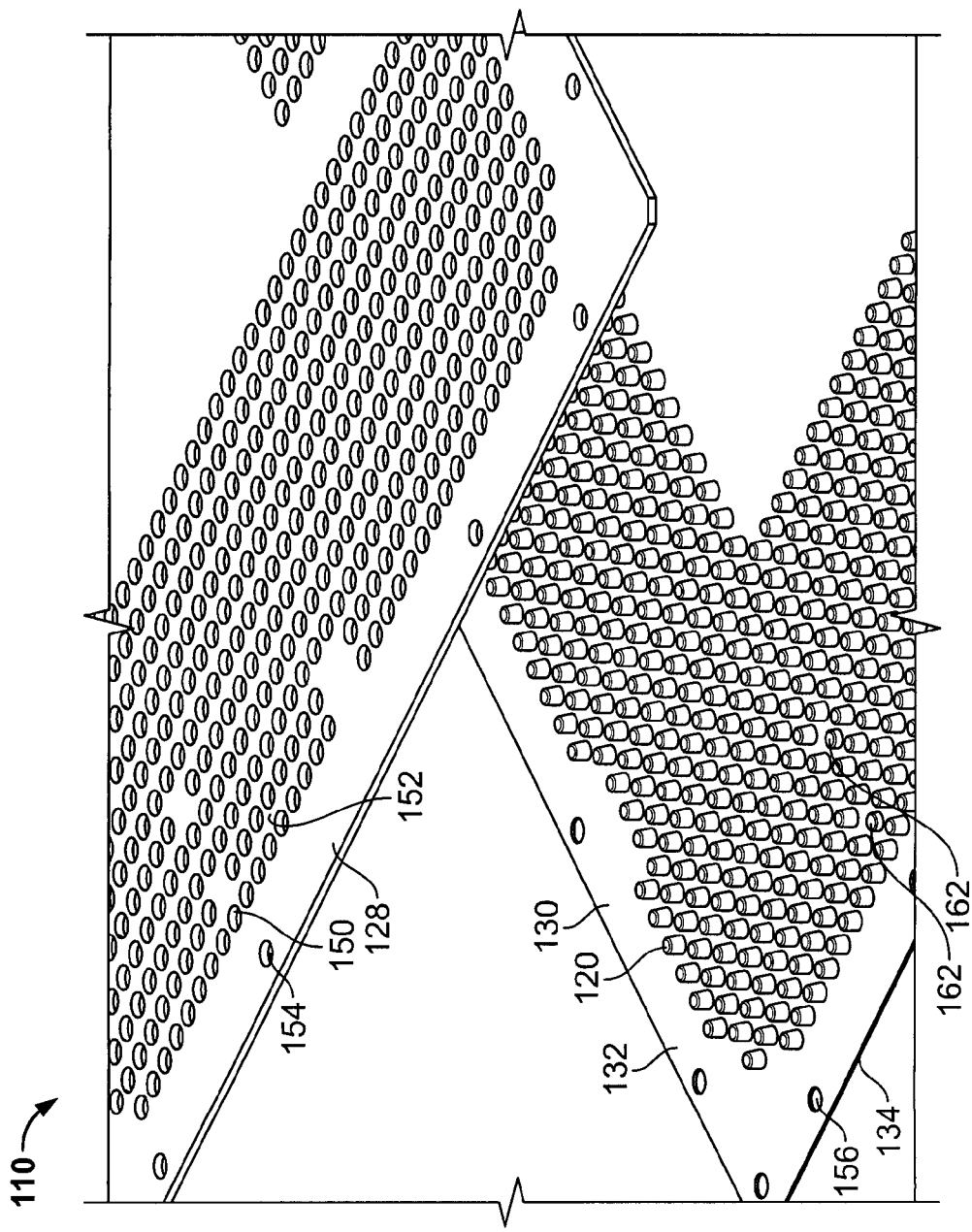
FIG. 3 is an enlarged view of a portion of the exploded electrical interconnect shown in FIG. 2.
Figure 4:
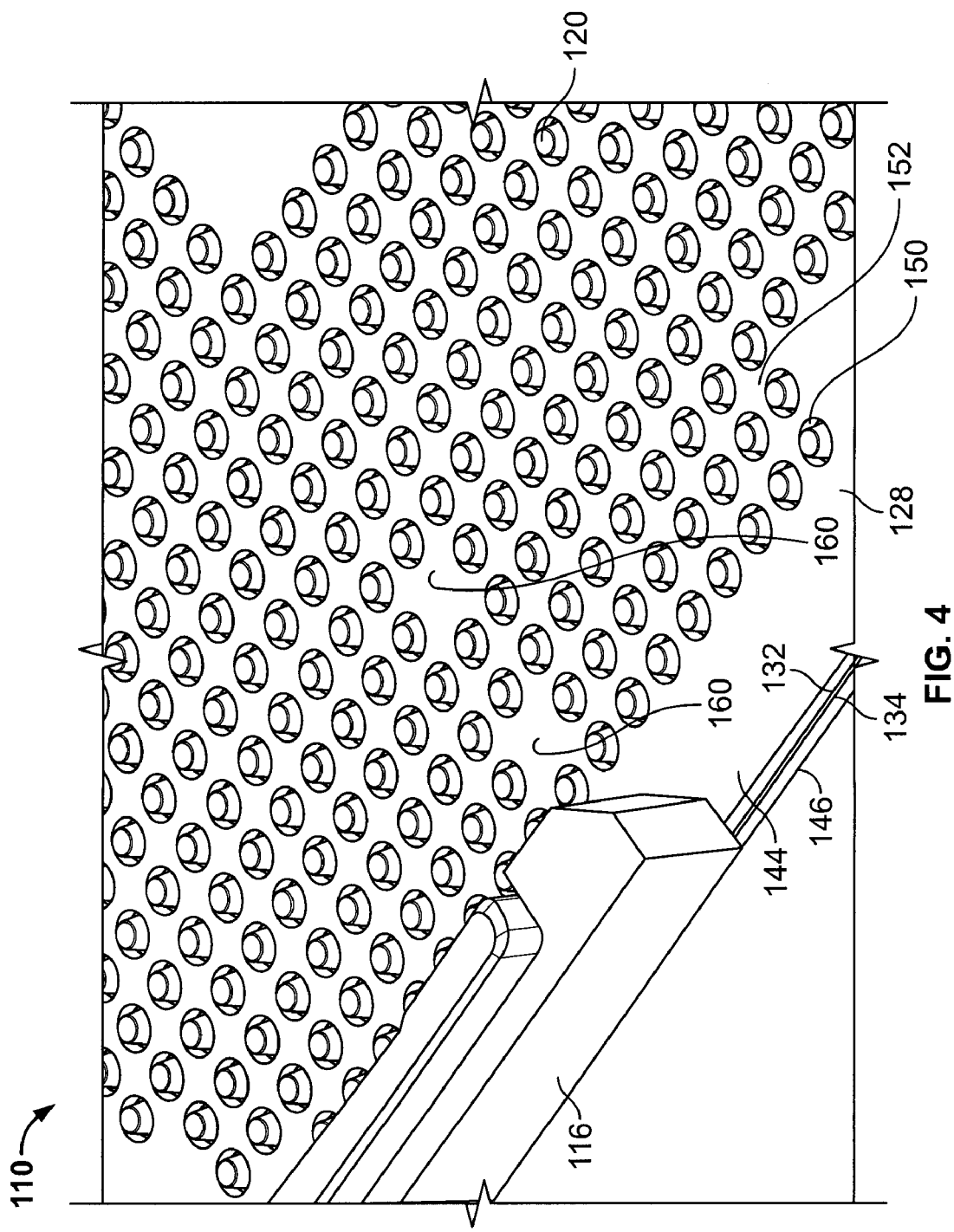
FIG. 4 is an enlarged view of a portion of the electrical interconnect shown in FIG. 2 in an assembled state.

FIG. 3 is an enlarged view of a portion of the exploded electrical interconnect 110 illustrating the contacts 120 arranged within the insulator 130. FIG. 4 is an enlarged view of a portion of the electrical interconnect 110 in an assembled state illustrating the frame 128 mounted to the contact array 122. The frame 128 includes a plurality of apertures 150 arranged in a predetermined pattern. The body of the frame 128 defines a frame web 152 between the apertures 150. In an exemplary embodiment, the frame 128 is fabricated from a metal or metal alloy. Optionally, the frame 128 may be anodized.

Prior to assembly, as illustrated in FIG. 3, the frame 128 is aligned with the contact array 122. The apertures 150 are sized to receive the contacts 120 and are aligned with the contacts 120. When assembled, as illustrated in FIG. 4, the frame 128 is mounted to the insulator 130. In an exemplary embodiment, both frame elements 144, 146 are utilized and mounted to opposite sides 132, 134 of the insulator 130. The contacts 120 extend through the apertures 150 in the frame 128, and the frame web 152 is positioned between adjacent contacts 120. The frame web 152 concentrically surrounds each of the contacts 120. In an exemplary embodiment, the apertures 150 in the frame 128 have a larger diameter than the diameter of the contacts 120, such that the frame web 152 is spaced apart from the contacts 120. The frame web 152, being positioned between each pair of adjacent contacts 120, operates to individually shield the contacts 120 from one another. Such shielding may increase the overall electrical performance of the electrical interconnect 110. For example, the shield may reduce interference, cross-talk, signal degradation and the like, which may enhance the signal throughput of the contacts 120.

The housing 116 (shown in FIG. 4) may be used to align each of the frame elements 144, 146 with the insulator 130, such as by extending through alignment holes 154, 156 (shown in FIG. 3) in the frame 128 and the insulator 130, respectively.

In an exemplary embodiment, the frame 128 is grounded to, or electrically commoned with, at least one of the first and second electronic packages 112, 114 (shown in FIG. 1). For example, a portion of the frame 128 may define a grounding pad 160 for electrically connecting with a grounding contact 162 (shown in FIG. 3). The grounding contact 162 may be electrically grounded to the corresponding electronic package. In the illustrated embodiment, the electrical interconnect 110 includes multiple grounding pads 160 and multiple grounding contacts 162.

Figure 5:
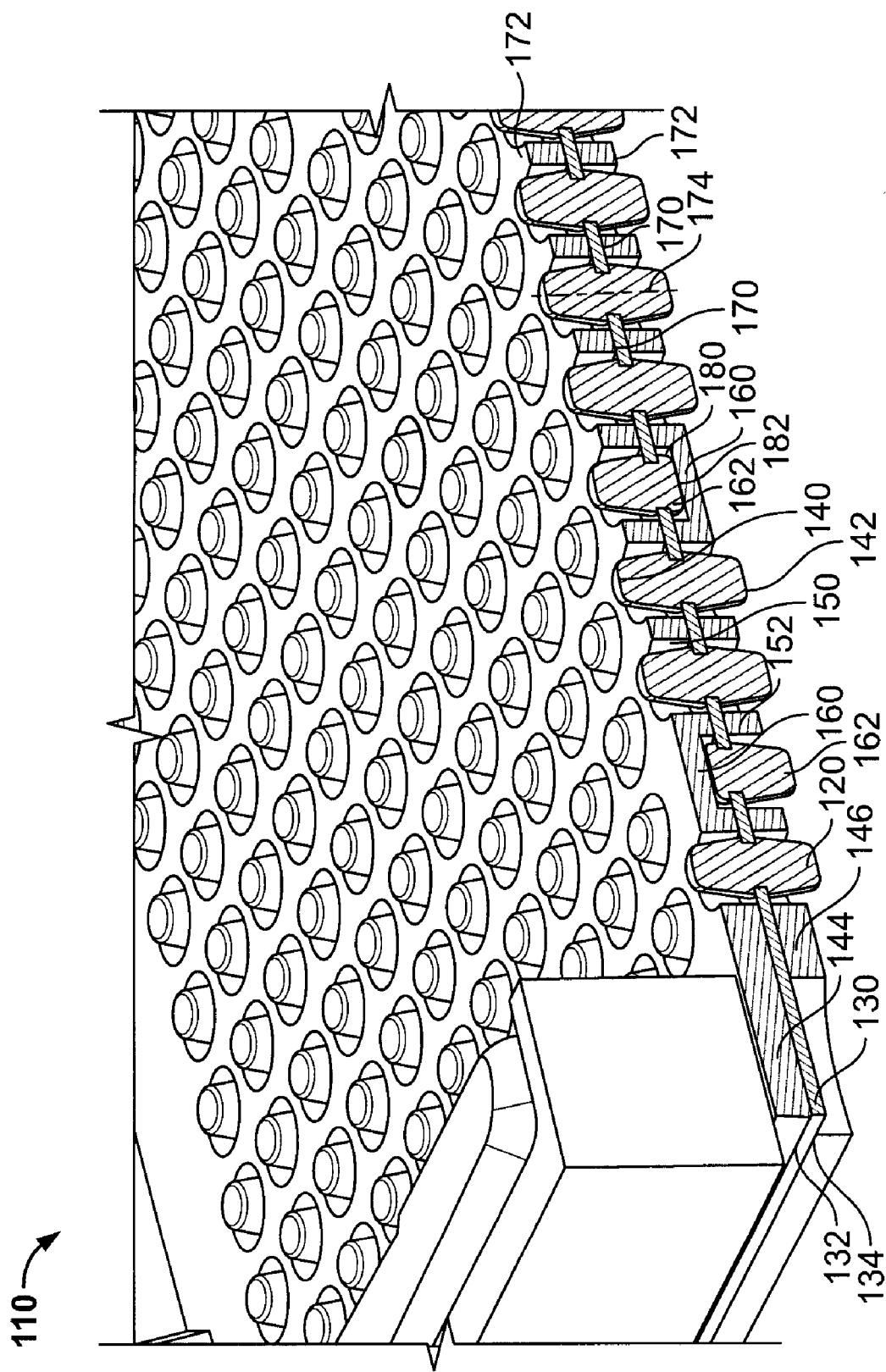
FIG. 5 is a cross-sectional view of a portion of the electronic assembly shown in FIG. 1.
Figure 6:
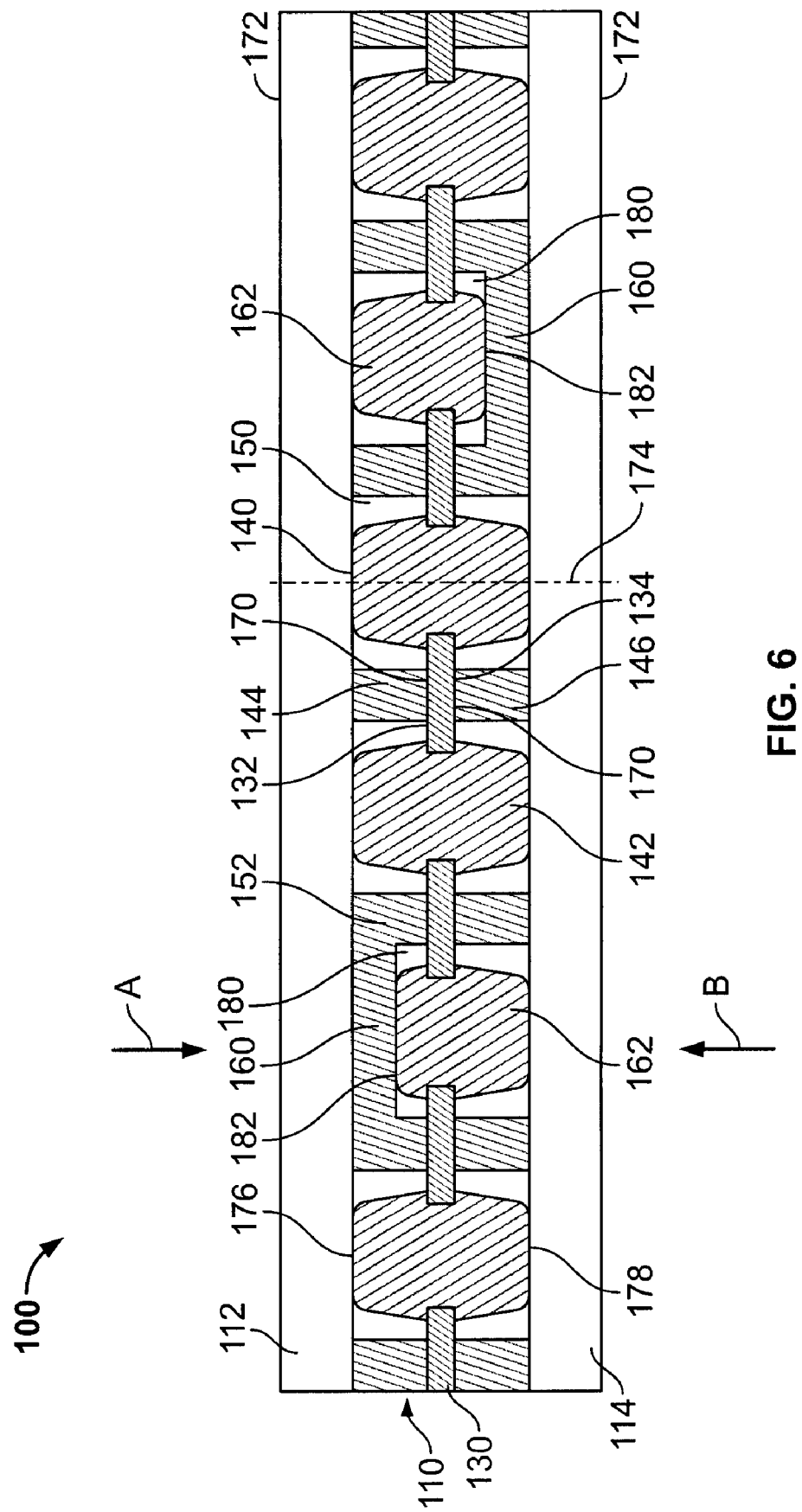
FIG. 6 is a cross sectional view of a portion of the electronic assembly shown in FIG. 1.

FIG. 5 is a cross-sectional view of a portion of the socket assembly 110. FIG. 6 is a cross sectional view of a portion of the electronic assembly 100 (shown in FIG. 1), illustrating the socket assembly 110 interconnecting the electronic packages 112, 114.

The insulator 130 is illustrated as holding the contacts 120. The first and second frame elements 144, 146 are provided on the first and second sides 132, 134 of the insulator 130. For example, each of the frame elements 144, 146 includes an inner surface 170 that engages the respective side 132, 134 of the insulator 130, and each of the frame elements 144, 146 include an outer surface 172 generally opposite to the inner surface 170. The outer surface 172 generally faces and/or engages the electronic package 112, 114, such as is shown in FIG. 6. The contacts 120 extend along a longitudinal axis 174 between the contact tips 140, 142. The frame apertures 150 are spaced apart from the contacts 120 and the frame web 152 concentrically surrounds portions of the contacts 120. The frame 128 provides electrical shielding for each of the contacts 120.

In an exemplary embodiment, the contacts 120 have a greater height from the insulator 130 than the frame 128 such that the contacts 120 extend above the outer surface of the frame 128. As a result, the contacts 120 may be compressed when placed under load by the electronic packages 112, 114. For example, as illustrated in FIG. 6, the electronic packages 112, 114 provide compressive forces in the directions of arrows A and B, respectively, onto the contacts 120. The contacts 120 are compressed by the loads from the electronic packages 112, 114. In an exemplary embodiment, the frame 128 operates as an anti-overstress load bearing member that stops or limits the amount of compression of the contacts 120. Optionally, the frame 128 is fabricated from a material that has a higher compressive ratio than the contacts 120. As such, the frame 128 is able to withstand a higher compressive load than the contacts 120. When the electronic assembly 100 is assembled, and the electronic packages 112, 114 are mated, the electronic packages 112, 114 may engage the outer surfaces 172 of the frame 128, however, the frame 128 may resist further compression of the electronic packages 112, 114. Additionally, when the electronic assembly 100 is assembled, the contacts 120 electrically interconnect the electronic packages 112, 114. For example, the contacts 120 may engage respective contact pads 176, 178 on the electronic packages 112, 114, and the metal particles within the columns 138 interconnect the electronic packages 112, 114.

FIGS. 5 and 6 also illustrate exemplary grounding pads 160 and grounding contacts 162. In the illustrated embodiment, the grounding pads 160 are defined by a portion of the frame elements 144, 146 extending over one of the contacts 120 that defines a grounding contact 162. For example, the frame elements 144, 146 do not include an aperture 150 at the grounding pad 160 location and a contact 120 having a reduced height engages the inner surface 170 of the frame element 144, 146. Optionally, the frame elements 144, 146 may include channels 180 that extend from the inner surface 170 only partially between the inner surface 170 and the outer surface 172 such that the channel 180 has a bottom 182. The grounding contact 162 at least partially fills the channel 180 and engages a portion of the channel 180, such as the bottom 182. When the grounding contact 162 engages the grounding pad 160, the grounding contact 182 is grounded to, or electrically commoned with, the frame element 144, 146. Optionally, the area of the frame element 144, 146 that interfaces with the grounding contact 162 may include a metallic or conductive pad or layer to facilitate electrical connection with the grounding contact 162. Optionally, the frame element 144, 146 may be non-anodized in the interface area. In other alternative embodiments, the frame may be grounded to the electronic packages 112, 114 in a different manner than by using the grounding contacts 162, such as by directly connecting with the electronic package 112, 114 or by connecting with a grounding pin (not shown) or other grounded component and/or element of the electronic package 112, 114.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical interconnect comprising:
   a contact array having an insulator holding a plurality of contacts, each of the contacts including a conductive polymer column having sidewalls extending between first and second opposite contact tips for electrically interconnecting first and second electronic packages, the sidewalls engaging the insulator, the contacts having a first thickness measured between the insulator and the first contact tips; and
   a grounded shield arranged between adjacent contacts, wherein each of the contacts are individually shielded from adjacent ones of the contacts by the shield, the shield having a shield thickness equal to or greater than half the first thickness.

2. The electrical interconnect of claim 1, wherein the contacts define a longitudinal axis between the opposite contact tips, wherein the shield is provided along the longitudinal axis between approximately the first contact tip and the insulator such that the shield thickness is substantially equal to the first thickness.

3. The electrical interconnect of claim 1, further comprising a frame provided on the insulator and positioned between each of the contacts, the frame defining the shield with the shield thickness being substantially equal to the first thickness, the frame having apertures concentrically surrounding each of the contacts substantially entirely between the insulator and the first contact tip.

4. The electrical interconnect of claim 1, wherein the grounded shield comprises a metallic frame being non-coplanar with, and parallel to, the insulator, the frame being electrically isolated from the contacts and providing shielding between adjacent ones of the contacts.

5. The electrical interconnect of claim 1, wherein the shield defines a load bearing member configured to be engaged by a portion of the first electronic package, wherein the shield limits compression of the contacts.

6. The electrical interconnect of claim 1, wherein the sidewalls are conductive, the shield being spaced apart from the sidewalls to electrically isolate the shield from the contacts.

7. The electrical interconnect of claim 1, wherein the shield has an inner surface engaging the insulator and an outer surface defining an outer surface of the electrical interconnect, the outer surface being configured to face the first electronic package.

8. An electrical interconnect comprising:
   a contact array having an insulator holding a plurality of contacts, each of the contacts including a conductive polymer column having first and second opposite contact tips for interconnecting first and second electronic packages, the insulator having a first surface and an opposite second surface; and
   first and second frames provided on the first and second surfaces, respectively, the first and second frames being electrically grounded, the first and second frames being discrete and separate from one another, each of the first and second frames having a plurality of apertures separated by a frame web, each aperture receiving a respective one of the contacts, the frame web individually shielding adjacent ones of the contacts, wherein the first and second frames are configured to be engaged by a portion of the first and second electronic packages, respectively, wherein each frame defines a load bearing member which limits compression of the contacts.

9. The electrical interconnect of claim 8, wherein the frame web concentrically surrounds each of the contacts generally between the insulator and the corresponding contact tips.

10. The electrical interconnect of claim 8, wherein each frame is non-coplanar with, and parallel to, the insulator, and each frame is metallic and spaced apart from the contacts such that each frame is electrically isolated from the contacts, the frames providing shielding between adjacent ones of the contacts.

11. The electrical interconnect of claim 8, wherein the contacts have first and second contact lengths measured between the insulator and the first and second contact tips, respectively, and wherein the first and second frames have first and second thicknesses, respectively, that are approximately equal to the first and second contact lengths such that each frame defines the load bearing member to limit compression of the contacts.

12. The electrical interconnect of claim 8, wherein first and second frames each having the apertures therethrough for receiving the contacts which are spaced apart from an outer periphery of the contacts, the first and second frames providing shielding along a majority of contact lengths of the contacts between the insulator and the first and second contact tips, respectively.

13. The electrical interconnect of claim 8, wherein each of the first and second frames includes a grounding pad, at least one of the contacts being electrically and mechanically connected to the grounding pad of each of the first and second frames to electrically common the first and second frames with the first and second electronic packages.

14. The electrical interconnect of claim 8, wherein the first frame includes an inner surface and an outer surface, the inner surface engaging the first surface of the insulator, the first frame includes a channel extending from the inner surface only partially between the inner surface and the outer surface, the channel having a bottom, wherein one of the contacts defines a grounding contact and engages the bottom of the channel to electrically common the grounding contact with the first frame.

15. An electronic assembly comprising:
a first electronic package;
a second electronic package; and
an electrical interconnect for interconnecting the first and second electronic packages, the electrical interconnect comprising a contact array having an insulator holding a plurality of contacts and a frame removably coupled to the insulator, wherein each of the contacts include a conductive polymer column having first and second opposite contact tips for engaging respective ones of the first and second electronic packages, and wherein the frame has a plurality of apertures each receiving a respective one of the contacts, the apertures being sized larger than the contacts such that the frame is spaced apart from the contacts, the frame individually shielding adjacent ones of the contacts.

16. The electronic assembly of claim 15, wherein the frame concentrically surrounds each of the contacts for a majority of a contact length of the contact between the insulator and the first contact tips.

17. The electronic assembly of claim 15, wherein the frame defines a load bearing member configured to be engaged by a portion of the first electronic package, wherein the frame limits compression of the contacts.

18. The electronic assembly of claim 15, wherein the frame includes a grounding pad, at least one of the contacts being electrically and mechanically connected to the grounding pad to electrically common the frame with the corresponding one of the first and second electronic packages.

19. The electronic assembly of claim 15, wherein the frame is spaced apart from the contacts such that voids are created between the frame and the contacts to provide electrical isolation between the frame and the contacts.

20. The electronic assembly of claim 15, wherein the contacts is a metallized particle interconnect column, the frame being spaced apart from the metallized particle interconnect column to electrically isolate the frame from the metallized particle interconnect column.

* * * * *